US012727287B2

(12) United States Patent
Lin et al.

(10) Patent No.: US 12,727,287 B2
(45) Date of Patent: Sep. 1, 2026

(54) LIGHT-EMITTING DIODE STRUCTURE

(71) Applicant: Taiwan-Asia Semiconductor Corporation, Hsinchu City (TW)

(72) Inventors: Kun-Te Lin, Hsinchu City (TW); Kuo-Chen Wu, Hsinchu City (TW); Ching-Shih Ma, Hsinchu City (TW)

(73) Assignee: TAIWAN-ASIA SEMICONDUCTOR CORPORATION, Hsinchu City (TW)

( * ) Notice: Subject to any disclaimer, the term of this patent is extended or adjusted under 35 U.S.C. 154(b) by 349 days.

(21) Appl. No.: 18/529,842

(22) Filed: Dec. 5, 2023

(65) Prior Publication Data

US 2024/0194825 A1 Jun. 13, 2024

(30) Foreign Application Priority Data

Dec. 8, 2022 (TW) ................................. 111147074

(51) Int. Cl.
*H10H 20/816* (2025.01)
*H10H 20/831* (2025.01)

(52) U.S. Cl.
CPC ...... *H10H 20/8162* (2025.01); *H10H 20/831* (2025.01)

(58) Field of Classification Search
CPC ................................................. H10H 20/8162
See application file for complete search history.

(56) References Cited

U.S. PATENT DOCUMENTS 9,214,607 B1 * 12/2015 Andrews ............ H10H 20/8506
2003/0222269 A1 * 12/2003 Lin .................... H10H 20/8162 257/E33.068
2011/0254044 A1 * 10/2011 Kuo ....................... H10H 20/84 438/42
2014/0327028 A1 * 11/2014 Matsumura ........ H10H 20/8162 257/98
2015/0048303 A1 * 2/2015 Tsou .................. H10H 20/8162 438/47
2021/0193868 A1 * 6/2021 Chen .................... H10H 20/833

FOREIGN PATENT DOCUMENTS

CN 104064647 A 9/2014
CN 108054256 A 5/2018
TW I497758 B 8/2015

* cited by examiner

*Primary Examiner* — Christopher A Johnson

(74) *Attorney, Agent, or Firm* — MUNCY, GEISSLER, OLDS & LOWE, P.C.

(57) ABSTRACT

The present invention provides a light-emitting diode structure, comprising a substrate, a first semiconductor layer, a second semiconductor layer, a second electrode and at least one current blocking trench. The substrate includes a first electrode. The first semiconductor layer is located on the substrate. The second semiconductor layer is located on the first semiconductor layer, and a light-emitting layer is formed between the first semiconductor layer and the second semiconductor layer. The second electrode is located on the second semiconductor layer. Each current blocking trench is recessed from a light exit surface of the second semiconductor layer toward the substrate. By means of the at least one current blocking trench, the current flowing from the second electrode flows through the light-emitting layer located outside the second electrode to the first electrode in a diffusing manner.

7 Claims, 6 Drawing Sheets

LIGHT-EMITTING DIODE STRUCTURE

CROSS-REFERENCES TO RELATED APPLICATIONS

This application claims priority to Taiwanese Patent Application No. 111147074 filed on Dec. 8, 2022, which is hereby incorporated by reference in its entirety.

BACKGROUND OF THE INVENTION

Field of the Invention

The present invention relates to a light-emitting diode structure, and in particular, to a light-emitting diode structure capable of improving light-emitting brightness.

Descriptions of the Related Art

Recently, light-emitting diodes have been widely used in lighting, medical and 3C products. Light-emitting diode chips are mainly made of various semiconductor materials. By the current flowing through the junction between two semiconductor materials, an electroluminescence effect for converting electrical energy into light energy is produced, enabling the light-emitting diode chip to emit high-brightness light and be more energy-saving.

In the structure design of the light-emitting diode chip, it is necessary to provide bonding wire electrodes on the surface of the chip for connection of the bonding wires. However, since a part of the aforementioned junction of the semiconductor materials is covered by the bonding wire electrode, the light generated by the current flowing through the portion of the junction covered by the bonding wire electrode cannot be emitted to the outside of the light-emitting diode chip. As a result, the light-emitting efficiency of the light-emitting diode chip is reduced and the brightness is attenuated.

Therefore, it is worthwhile to study how to design a light-emitting diode structure that can solve the above problems to improve light-emitting brightness.

SUMMARY OF THE INVENTION

The objective of the present invention is to provide a light-emitting diode structure capable of improving light-emitting brightness.

To achieve the above objective, the light-emitting diode structure of the present invention includes a substrate, a first semiconductor layer, a second semiconductor layer, a second electrode and at least one current blocking trench. The substrate includes a first electrode. The first semiconductor layer is located on the substrate. The second semiconductor layer is located on the first semiconductor layer, and a light-emitting layer is formed between the first semiconductor layer and the second semiconductor layer. The second electrode is located on the second semiconductor layer. Each current blocking trench is recessed from a light exit surface of the second semiconductor layer toward the substrate. By means of the at least one current blocking trench, the current flowing from the second electrode flows through the light-emitting layer located outside the second electrode to the first electrode in a diffusing manner.

In an embodiment of the present invention, each current blocking trench is filled with a high resistance material.

In an embodiment of the present invention, the high resistance material is identical to a material of the second electrode.

In an embodiment of the present invention, each current blocking trench is not in contact with the light-emitting layer.

In an embodiment of the present invention, a ratio of a thickness of the first semiconductor layer, a thickness of the second semiconductor layer and a depth of each current blocking trench is 1:3:2.

In an embodiment of the present invention, each current blocking trench is recessed to the first semiconductor layer but is not in contact with the substrate.

In an embodiment of the present invention, the at least one current blocking trench is covered by the second electrode, and each current blocking trench is spaced from a periphery of the second electrode.

In an embodiment of the present invention, the at least one current blocking trench is a single annular trench.

In an embodiment of the present invention, the at least one current blocking trench includes a plurality of trenches arranged in an annular shape and spaced apart from one another.

In an embodiment of the present invention, each current blocking trench is located outside a periphery of the second electrode and is not covered by the second electrode.

In an embodiment of the present invention, the second electrode includes a bonding pad portion and a plurality of extension portions. One end of each of the extension portions is connected to the bonding pad portion, and each current blocking trench is adjacent to the bonding pad portion and is located between two adjacent extension portions of the extension portions.

To achieve another objective mentioned above, the light-emitting diode structure of the present invention includes a substrate, a first semiconductor layer, a second semiconductor layer, a second electrode and at least one current blocking trench. The substrate includes a first electrode. The first semiconductor layer is located on the substrate. The second semiconductor layer is located on the first semiconductor layer, and a light-emitting layer is formed between the first semiconductor layer and the second semiconductor layer. The second electrode is located on the second semiconductor layer. At least one current blocking trench is provided for changing a current path from the second electrode to the first electrode so that the current flows through the light-emitting layer located outside the second electrode to the first electrode in a diffusing manner.

Accordingly, the present invention changes the current path from the second electrode to the first electrode by arrangement of at least one current blocking trench so as to enable most of the current to flow through the light-emitting layer located outside the region covered by the second electrode to the first electrode in a diffusing manner, thereby improving light-emitting brightness and uniformity.

DETAILED DESCRIPTION OF THE PREFERRED EMBODIMENT

Since the various aspects and embodiments are merely illustrative and not restrictive, those skilled in the art may conceive other aspects and embodiments without departing from the scope of the present invention. The features and advantages of these embodiments and the scope of the patent application will become apparent from the following detailed description.

Herein, the term "one", "a" or "an" is used to describe one or more devices and components described herein. Such a descriptive term is merely for the convenience of illustration and to provide a general sense of the scope of the present invention. Accordingly, unless otherwise indicated, the term "one", "a" or "an" should be understood to encompass one or at least one, and the singular form also includes the plural form.

Herein, the terms "first", "second" and similar ordinal numbers are mainly used to distinguish or refer to the same or similar devices or structures, and do not necessarily imply the spatial or temporal order of such devices or structures. It should be understood that in certain situations or configurations, ordinal numbers may be used interchangeably without affecting the practice of the present invention.

As used herein, the term "comprise" "include," "have" or any other similar term is not intended to exclude additional, unrecited elements. For example, a device or structure comprising/including/having a plurality of elements is not limited to the elements listed herein but may comprise/include/have other elements not explicitly listed but generally inherent to the device or structure.

Figure 1:
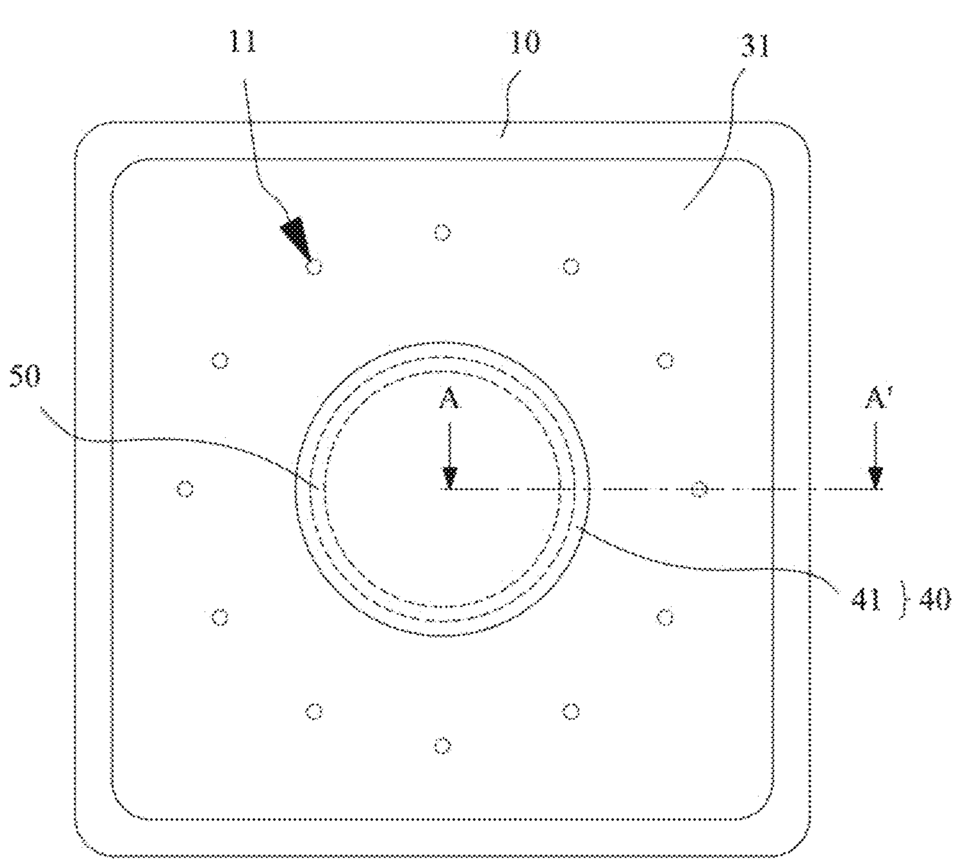
FIG. 1 is a top view of the light-emitting diode structure of the first embodiment according to the present invention.
Figure 2:
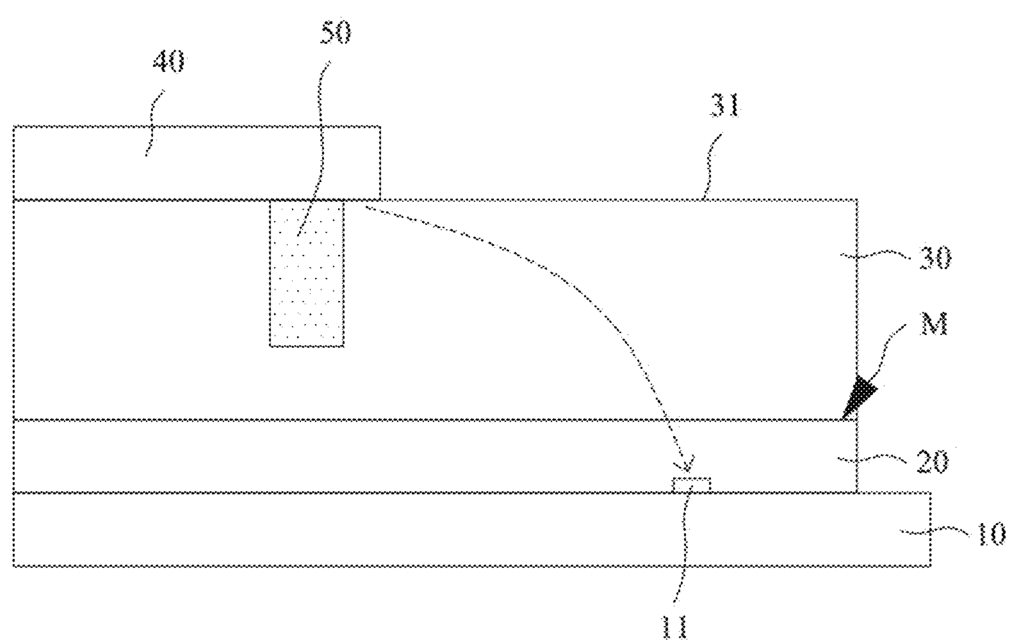
FIG. 2 is a cross-sectional view of the light-emitting diode structure of the first embodiment according to the present invention.

Hereinafter, reference is made FIGS. 1 and 2 regarding the light-emitting diode structure of the first embodiment according to the present invention, wherein FIG. 2 is a cross-sectional view along the line A-A' in FIG. 1. As shown in FIGS. 1 and 2, the light-emitting diode structure 1 of the present invention includes a substrate 10, a first semiconductor layer 20, a second semiconductor layer 30, a second electrode 40 and at least one current blocking trench 50. The substrate 10 is the base structure of the light-emitting diode structure 1, and the substrate 10 is preferably a silicon substrate, but the present invention is not limited thereto. The substrate 10 includes a first electrode 11 disposed on the surface of one side of the substrate 10. The first electrode 11 is embodied as a single or multiple metal dots, metal wires, metal surfaces, or a combination of any two or more thereof. First, for the purpose of illustrating the operating principle of the light-emitting diode structure 1 of the present invention, in the following embodiments, the first electrode 11 is presented in the form of a single or multiple metal dots.

The first semiconductor layer 20 is located on the substrate 10 and completely covers the first electrode 11. In the following embodiments, the first semiconductor layer 20 is made of gallium phosphide (GaP) as an example, but the present invention is not limited thereto. The first semiconductor layer 20 may also be made of other semiconductor materials. The first semiconductor layer 20 may be doped with different metals to form an N-type semiconductor or a P-type semiconductor.

The second semiconductor layer 30 is located on the first semiconductor layer 20. In the following embodiments, the second semiconductor layer 30 is made of aluminium gallium indium phosphide (AlGaInP) as an example, but the present invention is not limited thereto. The second semiconductor layer 30 may also be made of other semiconductor materials. The second semiconductor layer 30 may also be doped with different metals to form an N-type semiconductor or a P-type semiconductor. If the first semiconductor layer 20 is an N-type semiconductor, the second semiconductor layer 30 would be a P-type semiconductor. Conversely, if the first semiconductor layer 20 is a P-type semiconductor, the second semiconductor layer 30 would be an N-type semiconductor. A light-emitting layer M is formed between the first semiconductor layer 20 and the second semiconductor layer 30 (i.e., the light-emitting layer M is formed at the junction between the first semiconductor layer 20 and the second semiconductor layer 30), wherein the light-emitting layer M is a multiple quantum well (MQW) layer. In addition, the second semiconductor layer 30 has a light exit surface 31 opposite to the aforementioned junction.

The second electrode 40 is located on the light exit surface 31 of the second semiconductor layer 30, and ohmic contact is maintained between the second electrode 40 and the second semiconductor layer 30. The second electrode 40 can be connected to a power supply. By supplying power to the second electrode 40, a current is generated and flows toward the first electrode 11. In this embodiment, the second electrode 40 at least includes a bonding pad portion 41. A bonding wire electrically connected to another electronic device can be soldered to the bonding pad portion 41, but the present invention is not limited thereto.

The at least one current blocking trench 50 is formed by etching (e.g., dry etching or wet etching), and the number, position, shape and depth of the at least one current blocking trench 50 may be modified according to different design requirements. Each current blocking trench 50 is recessed from the light exit surface 31 of the second semiconductor layer 30 toward the substrate 10. In this embodiment, each current blocking trench 50 is not in contact with the light-emitting layer M. In other words, each current blocking trench 50 has a depth within the second semiconductor layer 30. For example, the depth of each current blocking trench 50 may be about 5 μm. In a preferred embodiment of the present invention, the ratio of the thickness of the first semiconductor layer 20, the thickness of the second semiconductor layer 30 and the depth of each current blocking trench 50 is 1:3:2, but the present invention is not limited thereto.

In this embodiment, at least one current blocking trench 50 is covered by the second electrode 40. In other words, at least one current blocking trench 50 is located below the second electrode 40. Therefore, each current blocking trench 50 cannot be seen from the top view showing the light exit surface 31 of the second semiconductor layer 30. Furthermore, each current blocking trench 50 is spaced from the periphery of the second electrode 40 so that the second electrode 40 has a portion between its periphery and each current blocking trench 50 that maintains ohmic contact with the second semiconductor layer 30. Furthermore, in this embodiment, at least one current blocking trench 50 is a single annular trench.

Each current blocking trench 50 mentioned above may remain hollow. In other words, only air serving as a current blocking medium is present in each current blocking trench 50. However, in the present invention, each current blocking trench 50 may also be filled with high resistance materials, e.g., silicon oxide, silicon nitride, aluminum nitride, magnesium fluoride, indium tin oxide, indium zinc oxide or other similar materials. In an embodiment of the present invention, the high resistance material filled in each current blocking trench 50 may be the same as the material of the second electrode 40. For example, during the process for forming the second electrode 40 by electroplating, the metal material for forming the second electrode 40 may be formed in each current blocking trench 50 as a filling material at the same time, but the present invention is not limited thereto.

The operating principle of the light-emitting diode structure 1 of the first embodiment according to the present invention is described below. As shown in FIGS. 1 and 2, the first electrode 11 of the substrate 10 of the light-emitting diode structure 1 of the present invention is disposed substantially outside the region covered by the second electrode 40. When the first electrode 11 is connected to the negative electrode of the power supply and the second electrode 40 is connected to the positive electrode of the power supply, the second electrode 40 generates a current flowing toward the first electrode 11. When the current flows through the light-emitting layer M between the first semiconductor layer 20 and the second semiconductor layer 30, an electroluminescence effect is produced and light is emitted toward the light exit surface 31 of the second semiconductor layer 30. The current tends to flow along a path having a lower resistance. Therefore, the normal current path is blocked by the arrangement of the annular trench so that most of the current selectively flows to the first electrode 11 through the region of the second electrode 40 between the annular trench and the periphery of the second electrode 40 (as indicated by the dotted arrow in FIG. 2), and only a very small part of the current flows to the first electrode 11 through the region of the second electrode 40 surrounded by the annular trench. Accordingly, the light-emitting diode structure 1 of the present invention enables the current flowing from the second electrode 40 to flow through the light-emitting layer M located outside the region covered by the second electrode 40 in a diffusing manner, thereby improving the light-emitting brightness.

Figure 3:
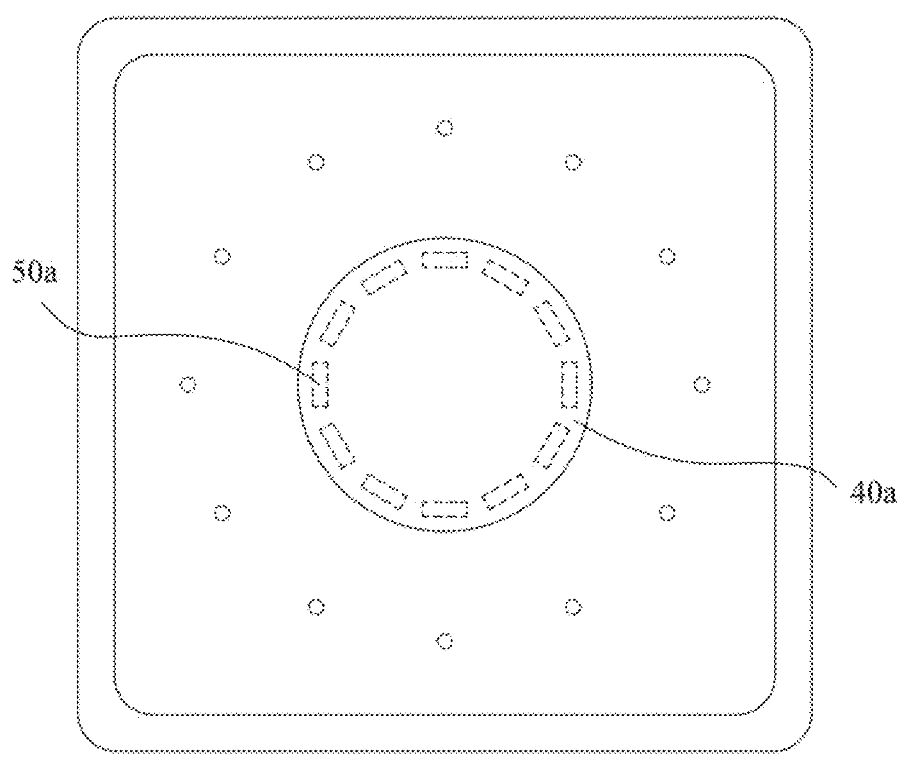
FIG. 3 is a top view of the light-emitting diode structure of the second embodiment according to the present invention.

Reference is made to FIG. 3, which is a top view of the light-emitting diode structure of the second embodiment according to the present invention. This embodiment is a variation of the first embodiment of the light-emitting diode structure 1 of the present invention. As shown in FIG. 3, in this embodiment, at least one current blocking trench 50*a* of the light-emitting diode structure 1*a* of the present invention includes a plurality of trenches arranged in an annular shape and spaced apart from one another. For example, when the second electrode 40*a* is integrally formed with the high resistance material filled into each current blocking trench 50*a*, the design of multiple trenches spaced apart from each other ensures a stable connection between the second electrode 40*a* and the high resistance material filled into each current blocking trench 50*a*. This reduces the possibility of the structure cracking or breaking, while enhancing the light-emitting brightness.

Figure 4:
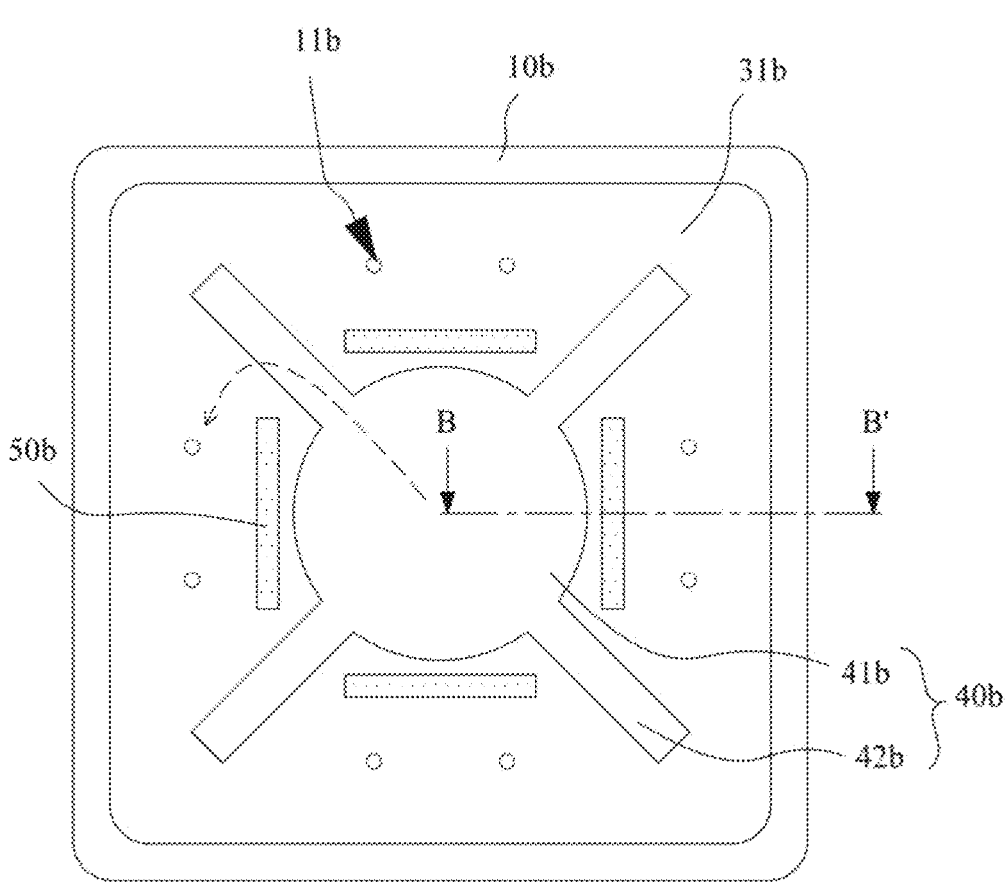
FIG. 4 is a top view of the light-emitting diode structure of the third embodiment according to the present invention.
Figure 5:
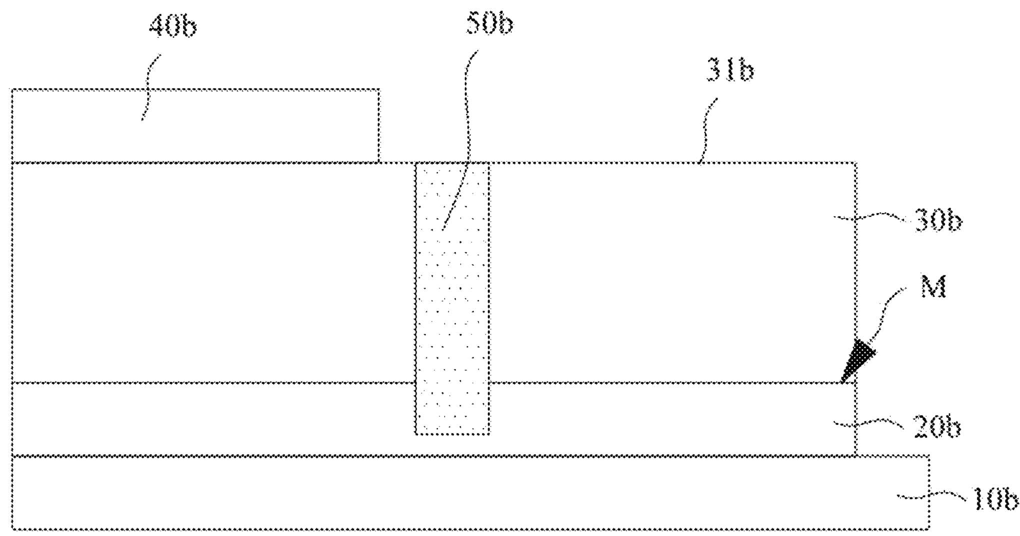
FIG. 5 is a cross-sectional view of the light-emitting diode structure of the third embodiment according to the present invention.

Reference is made to FIGS. 4 and 5 regarding the light-emitting diode structure of the third embodiment according to the present invention. FIG. 4 is a top view of the light-emitting diode structure of the third embodiment according to the present invention. FIG. 5 is a cross-sectional view along the line B-B' in FIG. 4. As shown in FIGS. 4 and 5, in this embodiment, the light-emitting diode structure 1*b* of the present invention includes a substrate 10*b*, a first semiconductor layer 20*b*, a second semiconductor layer 30*b*, a second electrode 40*b* and at least one current blocking trench 50*b*. As compared with the first embodiment, in this embodiment, the structures and positions of the second electrode 40*b* and the at least one current blocking trench 50*b* are modified.

In this embodiment, the second electrode 40*b* includes a bonding pad portion 41*b* and a plurality of extension portions 42*b*. One end of each extension portion 42*b* is connected to the bonding pad portion 41*b*, and the other end of each extension portion 42*b* extends in a direction away from the bonding pad portion 41*b*. The plurality of extension portions 42*b* can serve as a current path extending from the bonding pad portion 41*b*. The number, position and shape of the extension portions 42*b* may be modified according to different design requirements.

In this embodiment, each current blocking trench 50*b* is located outside the periphery of the second electrode 40*b*. In other words, each current blocking trench 50*b* is not covered by the second electrode 40*b*. Therefore, each current blocking trench 50*b* can be seen from the top view showing the light exit surface 31 of the second semiconductor layer 30. In the design, each current blocking trench 50*b* is adjacent to the bonding pad portion 41*b* and spaced from the bonding pad portion 41*b*, and each current blocking trench 50*b* is located between two adjacent extension portions 42*b* of the extension portions 42*b* but is not in contact with the extension portion 42*b*.

In this embodiment, each current blocking trench 50*b* is recessed to the first semiconductor layer 20*b* but is not in contact with the substrate 10. In other words, each current blocking trench 50*b* penetrates the second semiconductor layer 30*b* and the light-emitting layer M, and each current blocking trench 50*b* has a depth reaching the first semiconductor layer 20*b*, but the present invention is not limited thereto. For example, in an embodiment of the present invention, each current blocking trench 50*b* may penetrate the first semiconductor layer 20*b* and be in contact with the substrate 10.

As shown in FIGS. 4 and 5, in this embodiment, the first electrode 11*b* of the substrate 10*b* of the light-emitting diode structure 1*b* of the present invention is disposed substantially outside the region covered by the second electrode 40*b*, and is located between the bonding pad portion 41*b* and the extension portions 42*b* of the second electrode 40*b*. When the first electrode 11*b* is connected to the negative electrode of the power supply and the second electrode 40*b* is connected to the positive electrode of the power supply, each current blocking trench 50*b* blocks the current path for the current flowing directly from the bonding pad portion 41*b* to the first electrode 11*b*. Furthermore, due to the characteristic that the current tends to flow along a path having a lower resistance, the current flowing from the bonding pad portion 41*b* flows along each extension portion 42*b* for the current diffusion effect and then flows from each extension portion 42*b* toward the first electrode 11*b* (as indicated by the dotted arrow in FIG. 4). When the current flows through the light-emitting layer M between the first semiconductor layer 20*b* and the second semiconductor layer 30*b*, an electroluminescence effect is produced and light is emitted toward the light exit surface 31 of the second semiconductor layer 30. Accordingly, by the extension portions 42*b*, the light-emitting diode structure 1*b* of the present invention can enlarge the region through which the current flows and thus enables the current to flow through the light-emitting layer M located outside the region covered by the second electrode 40 in a diffusing manner, thereby improving the light-emitting brightness.

Figure 6:
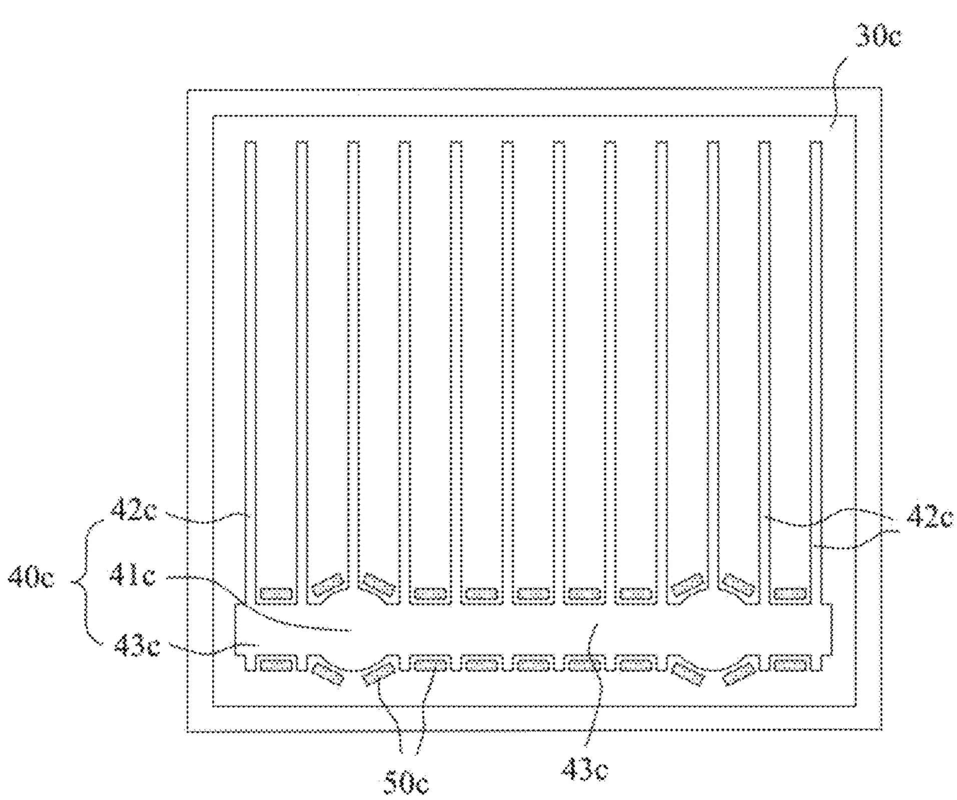
FIG. 6 is a top view of the light-emitting diode structure of the fourth embodiment according to the present invention.

Reference is made to FIG. 6 regarding the light-emitting diode structure of the fourth embodiment according to the present invention. This embodiment is a variation of the third embodiment of the light-emitting diode structure 1*b* of the present invention. As shown in FIG. 6, in this embodiment, the second electrode 40*c* of the light-emitting diode structure 1*c* of the present invention includes a plurality of bonding pad portions 41*c*, a plurality of extension portions 42*c* and at least one strip portion 43*c*. Two adjacent bonding pad portions 41*c* are connected with each other by the strip portion 43*c*. One end of each extension portion 42*c* is connected to the bonding pad portion 41*c* or the bus 43*c*, and the other end of each extension portion 42*c* extends in a direction away from the bonding pad portion 41*c* or the strip portion 43*c*. The configuration design of the extension portions 42*c* may be modified according to different die sizes or requirements.

In this embodiment, each current blocking trench 50*c* is adjacent to the bonding pad portion 41*c* or the strip portion 43*c* and spaced from the bonding pad portion 41*c* or the strip portion 43*c*. Each current blocking trench 50*c* is located between two adjacent extension portions 42*c* of the extension portions 42*c* but is not in contact with the extension portions 42*c*. For example, the current blocking trench 50*c* is spaced from the extension portions 42*c* by a distance greater than 3 μm, preferably about 5~8 μm. In addition, in this embodiment, each current blocking trench 50*c* may have a depth within the second semiconductor layer and is not in contact with the light-emitting layer. However, each current blocking trench 50*c* may be recessed to the first semiconductor layer, but the present invention is not limited thereto.

As compared with the third embodiment, this embodiment can further improve the uniform diffusion of the current by means of the dense arrangement of the extension portions 42*c*, thereby improving the light-emitting brightness and uniformity.

The light-emitting diode structure of the present invention includes a substrate, a first semiconductor layer, a second semiconductor layer, a second electrode and at least one current blocking trench. The substrate includes a first electrode. The first semiconductor layer is located on the substrate. The second semiconductor layer is located on the first semiconductor layer, and a light-emitting layer is formed between the first semiconductor layer and the second semiconductor layer. The second electrode is located on the second semiconductor layer. By arrangement of the at least one current blocking trench, the current path from the second electrode to the first electrode can be changed. As a result, the current flows through the light-emitting layer located outside the second electrode to the first electrode in a diffusing manner, thereby reducing the possibility of the current flowing to the first electrode through the light-emitting layer located below the second electrode (i.e., the portion of the light-emitting layer covered by the second electrode) as much as possible to improve the light-emitting brightness.

The foregoing detailed description is illustrative in nature only and is not intended to limit the embodiments of the claimed subject matters or the applications or uses of such embodiments. Furthermore, while at least one exemplary embodiment has been presented in the foregoing detailed description, it should be appreciated that a wide variety of modifications to the present invention are possible. It should also be appreciated that the embodiments described herein are not intended to limit the scope, use, or configuration of the claimed subject matters in any way. Instead, the foregoing detailed description is intended to provide a person having ordinary skill in the art with a convenient guide for implementing one or more of the described embodiments. Moreover, various modifications may be made in the function and arrangement of the devices without departing from the scope defined by the claims, including known equivalents and any equivalents that may be anticipated at the time of filing this patent application.

What is claimed is:

1. A light-emitting diode structure, comprising:

a substrate, comprising a first electrode;

a first semiconductor layer located on the substrate;

a second semiconductor layer located on the first semiconductor layer, wherein a light-emitting layer is formed between the first semiconductor layer and the second semiconductor layer;

a second electrode located on the second semiconductor layer; and at least one current blocking trench recessed from a light exit surface of the second semiconductor layer toward the substrate;

wherein by means of the at least one current blocking trench, the current flowing from the second electrode flows through the light-emitting layer located outside the second electrode to the first electrode in a diffusing manner;

wherein each of the at least one current blocking trench is located outside a periphery of the second electrode and is not covered by the second electrode; and wherein the second electrode comprises a bonding pad portion and a plurality of extension portions, one end of each of the extension portions is connected to the bonding pad portion, and each of the at least one current blocking trench is adjacent to the bonding pad portion and is located between two adjacent extension portions of the extension portions.

2. The light-emitting diode structure of claim 1, wherein each of the at least one current blocking trench is filled with a high resistance material.

3. The light-emitting diode structure of claim 2, wherein the high resistance material is identical to a material of the second electrode.

4. The light-emitting diode structure of claim 1, wherein each of the at least one current blocking trench is not in contact with the light-emitting layer.

5. The light-emitting diode structure of claim 4, wherein a ratio of a thickness of the first semiconductor layer, a thickness of the second semiconductor layer and a depth of each of the at least one current blocking trench is 1:3:2.

6. The light-emitting diode structure of claim 1, wherein each of the at least one current blocking trench is recessed to the first semiconductor layer but is not in contact with the substrate.

7. A light-emitting diode structure, comprising:

a substrate, comprising a plurality of metal dots;

a first semiconductor layer located on the substrate;

a second semiconductor layer located on the first semiconductor layer, wherein a light-emitting layer is formed between the first semiconductor layer and the second semiconductor layer;

at least one bonding wire electrode located on the second semiconductor layer; and at least one current blocking trench for changing a current path from the at least one bonding wire electrode to the plurality of metal dots so that the current flows through the light-emitting layer located outside the at least one bonding wire electrode to the plurality of metal dots in a diffusing manner;

wherein each of the at least one current blocking trench is located outside a periphery of the at least one bonding wire electrode and is not covered by the at least one bonding wire electrode; and wherein the at least one bonding wire electrode comprises a bonding pad portion and a plurality of extension portions, one end of each of the extension portions is connected to the bonding pad portion, and each of the at least one current blocking trench is adjacent to the bonding pad portion and is located between two adjacent extension portions of the extension portions.

* * * * *